United States Patent
Chen (10) Patent No.: US 8,084,353 B2
(45) Date of Patent: Dec. 27, 2011

(54) METHODS FOR PITCH REDUCTION FORMATION

(75) Inventor: Chien Wei Chen, Santa Clara, CA (US)

(73) Assignee: Macronix International Co., Ltd., Hsinchu (TW)

(*) Notice: Subject to any disclaimer, the term of this patent is extended or adjusted under 35 U.S.C. 154(b) by 589 days.

(21) Appl. No.: 11/891,607

(22) Filed: Aug. 10, 2007

(65) Prior Publication Data

US 2008/0050900 A1 Feb. 28, 2008

Related U.S. Application Data

(63) Continuation of application No. 11/009,496, filed on Dec. 10, 2004, now Pat. No. 7,256,126.

(60) Provisional application No. 60/541,638, filed on Feb. 3, 2004.

(51) Int. Cl.
*H01L 21/8242* (2006.01)
*H01L 21/4763* (2006.01)
*H01L 23/48* (2006.01)

(52) U.S. Cl. ........... 438/622; 438/253; 257/225

(58) Field of Classification Search .......... 438/253, 438/622; 257/225
See application file for complete search history.

(56) References Cited

U.S. PATENT DOCUMENTS

| | | | |
|---|---|---|---|
| 5,328,810 A | 7/1994 | Lowrey et al. | |
| 6,110,837 A | 8/2000 | Linliu et al. | |
| 6,277,727 B1 * | 8/2001 | Kuo et al. | 438/618 |
| 6,376,294 B1 | 4/2002 | Tzeng et al. | |
| 6,395,596 B1 | 5/2002 | Chien et al. | |
| 6,403,417 B1 | 6/2002 | Chien et al. | |
| 6,416,933 B1 | 7/2002 | Singh et al. | |
| 6,518,125 B1 | 2/2003 | Chang | |
| 6,638,441 B2 | 10/2003 | Chang et al. | |
| 6,734,107 B2 | 5/2004 | Lai et al. | |
| 6,750,150 B2 | 6/2004 | Chung et al. | |
| 6,774,051 B2 * | 8/2004 | Chung et al. | 438/778 |
| 6,867,116 B1 | 3/2005 | Chung | |
| 6,887,627 B2 | 5/2005 | Chung et al. | |
| 6,893,972 B2 | 5/2005 | Rottstegge et al. | |
| 6,946,400 B2 | 9/2005 | Chung | |
| 7,183,205 B2 | 2/2007 | Hong | |
| 2003/0027420 A1 | 2/2003 | Lai et al. | |
| 2003/0134478 A1 | 7/2003 | Lai et al. | |
| 2005/0079722 A1 | 4/2005 | Yu | |
| 2005/0272259 A1 | 12/2005 | Hong | |
| 2006/0240361 A1 * | 10/2006 | Lee et al. | 430/313 |
| 2007/0293041 A1 * | 12/2007 | Yang et al. | 438/637 |

FOREIGN PATENT DOCUMENTS

| | | |
|---|---|---|
| JP | 05-190811 | 7/1993 |
| JP | 06-151876 | 5/1994 |

* cited by examiner

*Primary Examiner* — James Mitchell
(74) *Attorney, Agent, or Firm* — Haynes Beffel & Wolfeld LLP (57) ABSTRACT

Methods and apparatus for providing a memory array fabrication process that concurrently forms memory array elements and peripheral circuitry. The invention relates to a method for fabricating memory arrays using a process that concurrently forms memory array elements and peripheral circuitry and results in a reduction in pitch.

13 Claims, 13 Drawing Sheets

METHODS FOR PITCH REDUCTION FORMATION

CROSS-REFERENCE TO RELATED APPLICATIONS

This application is a continuation of pending U.S. patent application Ser. No. 11/009,496 filed on 10 Dec. 2004, which application claims the benefit of U.S. Provisional Application No. 60/541,638, filed on 3 Feb. 2004, both of which are incorporated by reference herein.

BACKGROUND

This invention relates to memory array fabrication.

Memory arrays are typically implemented on an integrated circuit device. Examples of these devices include Mask ROM, Flash, EPROM, DRAM, FeRAM, MRAM, and NROM.

Memory arrays generally include one or more memory array elements, which are structures that store data, typically in the form of one or more high or low values. A register of one or more flip-flops is one example of a memory array element.

In some instances, a memory array element is a memory cell. Memory cells of a memory array are typically arranged in a pattern. In one type of pattern, memory cells are arranged to form a word line. The distance between adjacent word lines, usually called the "pitch," is usually uniform for a given memory array. In some instances, pitch can be measured on a space-to-space basis instead of on a line-to-line basis, where space refers to the area between adjacent lines.

Different memory arrays can have different pitches. A first memory array can have, for example, a first pitch that is less than a second pitch of a second memory array. For a given distance, the first memory array has more word lines than does the second memory array. Reducing the pitch of a memory array generally refers to a fabrication process in which more word lines are added to a particular area that already includes existing word lines.

Memory arrays are typically connected to peripheral circuitry, which are generally components on a memory chip that are not memory cells. Examples of peripheral circuitry include and are not limited to decoders and connections between word lines.

SUMMARY

The invention provides methods, systems and apparatus, including computer program products, for providing a memory array fabrication process that concurrently forms memory array elements and peripheral circuitry. In one implementation, the memory array elements and the peripheral circuitry are concurrently formed by a process that results in reduced pitch.

In general, in one aspect, the invention provides a process for fabricating a memory array. The process includes applying a first mask on a surface of a memory-array material, the first mask being patterned to define a first set of structures of the memory array and to cover an area of the surface where peripheral circuitry of the memory array is to be formed, the first set of structures from which memory-array elements are formed having a first pitch. The process includes etching the memory-array material to form the first set of structures, the etching not removing portions of memory-array material from which the peripheral circuitry is to be formed. The process includes removing the first mask to expose the area of the surface where peripheral circuitry of the memory array is to be formed. The process includes applying a second mask on the surface of the memory-array material, the second mask being patterned to define the memory-array elements and the peripheral circuitry, the memory-array elements having a second pitch that is less than the first pitch. The process includes etching the memory-array material to form concurrently the memory array and peripheral circuitry.

In general, in another aspect, the invention provides a method for fabricating a memory array. The method includes forming sequentially, on top of a substrate, a gate oxide layer, a first polysilicon layer, a stop layer, a second polysilicon layer, and a first patterned photoresist layer, each layer having a top surface. The process includes forming a first polymer layer on the top surface of the first patterned photoresist layer, the first patterned photoresist layer and the first polymer layer being a first etching mask. The process includes etching portions of the second polysilicon layer, the stop layer, and the first polysilicon layer not covered by the first etching mask, the etching forming trenches, in the second polysilicon layer, the stop layer, and the first polysilicon player, the trenches exposing portions of the top surface of the gate oxide layer. The process includes removing the first photoresist layer and the polymer layer. The process includes forming a dielectric layer on the top surface of second polysilicon layer and the exposed portions of the top surface of the gate oxide layer, the dielectric layer filing the trenches. The process includes etching back the dielectric layer such that the top surface of the second polysilicon layer is exposed. The method includes removing the second polysilicon layer. The method includes forming a second patterned photoresist layer on the top surface of the stop layer, the second patterned photoresist layer covering areas of the top surface of the stop layer under which peripheral circuitry are to be formed. The method includes forming a second polymer layer on top of the second patterned photoresist layer and also on top of exposed surfaces of the dielectric layer, the second patterned photoresist layer and the second polymer layer being a second etching mask. The method includes etching portions of the stop layer not covered by the second mask, the etching forming additional trenches in the stop layer that exposes other portions of the top surface of the gate oxide layer. The method includes removing the second patterned photoresist layer and the second polymer layer. The method includes forming a third patterned photoresist layer on top of the stop layer, the third patterned photoresist layer being patterned to define memory array elements and peripheral circuitry, the third patterned photoresist layer being a third etching mask. The method includes etching, to the top surface of the gate oxide layer, portions of the stop layer and the first polysilicon layer not covered by the third etching mask such that additional portions of the top surface of the gate oxide layer are exposed. The method includes removing the third etching mask and the dielectric layer.

In general, in another aspect, the invention provides a method for fabricating a memory array. The method includes forming sequentially, on top of a substrate, a gate oxide layer, a first polysilicon layer, a stop layer, a second polysilicon layer, and a first patterned photoresist layer, each layer having a top surface. The method includes forming a first polymer layer on the top surface of the first patterned photoresist layer, the first patterned photoresist layer and the first polymer layer being a first etching mask. The method includes etching portions of the second polysilicon layer and the stop layer that are not covered by the first etching mask, the etching forming trenches, in the second polysilicon layer and the stop layer, the trenches exposing portions of the top surface of the first polysilicon layer. The method includes removing the first photoresist layer and the polymer layer. The method includes forming a dielectric layer on the top surface of second polysilicon layer and the exposed portions of the top surface of the first polysilicon layer, the dielectric layer filing the trenches. The method includes etching back the dielectric layer such that the top surface of the second polysilicon layer is exposed. The method includes removing the second polysilicon layer. The method includes forming a second patterned photoresist layer on the top surface of the stop layer, the second patterned photoresist layer covering areas of the top surface of the stop layer under which peripheral circuitry are to be formed. The method includes forming a second polymer layer on top of the second patterned photoresist layer and also on top of exposed surfaces of the dielectric layer, the second patterned photoresist layer and the second polymer layer being a second etching mask. The method includes etching portions of the stop layer not covered by the second mask, the etching forming additional trenches in the stop layer that exposes other portions of the first polysilicon layer. The method includes removing the second patterned photoresist layer and the second polymer layer. The method includes forming a third patterned photoresist layer on top of the stop layer, the third patterned photoresist layer being patterned to define memory array elements and peripheral the third patterned photoresist layer being a third etching mask. The method includes etching, to the top surface of the first polysilicon layer, portions of the stop layer and the first polysilicon layer not covered by the third etching mask such that additional portions of the top surface of the first polysilicon layer are exposed. The method includes removing the third etching mask and the dielectric layer. The method includes etch portions of the first polysilicon that are not covered by stop layer and form a memory array and peripheral circuitry.

In general, in another aspect, the invention provides a computer program product, tangibly stored on machine readable medium, for controlling a memory array fabrication system. The product includes instructions operable to cause the system to apply a first mask on a surface of a memory-array material, the first mask being patterned to define a first set of structures of the memory array and to cover an area of the surface where peripheral circuitry of the memory array is to be formed, the first set of structures from which memory-array elements are formed having a first pitch. The product includes instructions to etch the memory-array material to form the first set of structures, the etching not removing portions of memory-array material from which the peripheral circuitry is to be formed. The product includes instructions to remove the first mask to expose the area of the surface where peripheral circuitry of the memory array is to be formed. The product includes instructions to apply a second mask on the surface of the memory-array material, the second mask being patterned to define the memory-array elements and the peripheral circuitry, the memory-array elements having a second pitch that is less than the first pitch. The product includes instructions to etch the memory-array material to form concurrently the memory array and peripheral circuitry.

The invention can be implemented to realize one or more of the following advantages. A system in accordance with the invention saves time and resources by concurrently forming memory array elements and peripheral circuitry in a process that results in reduced pitch. The system can ensure that the memory array elements, such as, for example, memory cells of a word line, are connected to their respective peripheral circuitries. The system can provide a wider outer pitch, which provides a large processing window and improve lithography alignment.

The details of one or more implementations of the invention are set forth in the accompanying drawings and the description below. Other features, objects, and advantages of the invention will be apparent from the description and drawings, and from the claims.

DETAILED DESCRIPTION

The invention relates to a method for fabricating memory arrays using a process that concurrently forms memory array elements and peripheral circuitry and results in a reduction in pitch. The method includes forming a first mask that covers a portion of a work piece where the peripheral circuitry is to be formed. The first mask leaves exposed a portion of the work piece where the memory array elements are to be formed. The method includes preparing, while the first mask is present, the exposed portion where the memory array elements are to be formed. Preparation of the exposed portion usually includes etching and, furthermore, usually results in partially completed memory array elements. The partially completed memory array elements have a pitch. Preparation of the exposed portion where the memory array elements are to be formed can further include pitch reduction. The first mask protects the covered portion during this part of the process. Once preparation of the memory array elements in the exposed portion is complete, the method includes removing the first mask and forming a second mask that is patterned so that further etching completes the formation of the memory array elements and concurrently forms peripheral circuitry. The completed memory array elements can have a pitch that is less than the pitch of the partially completed memory array elements.

Figure 1:
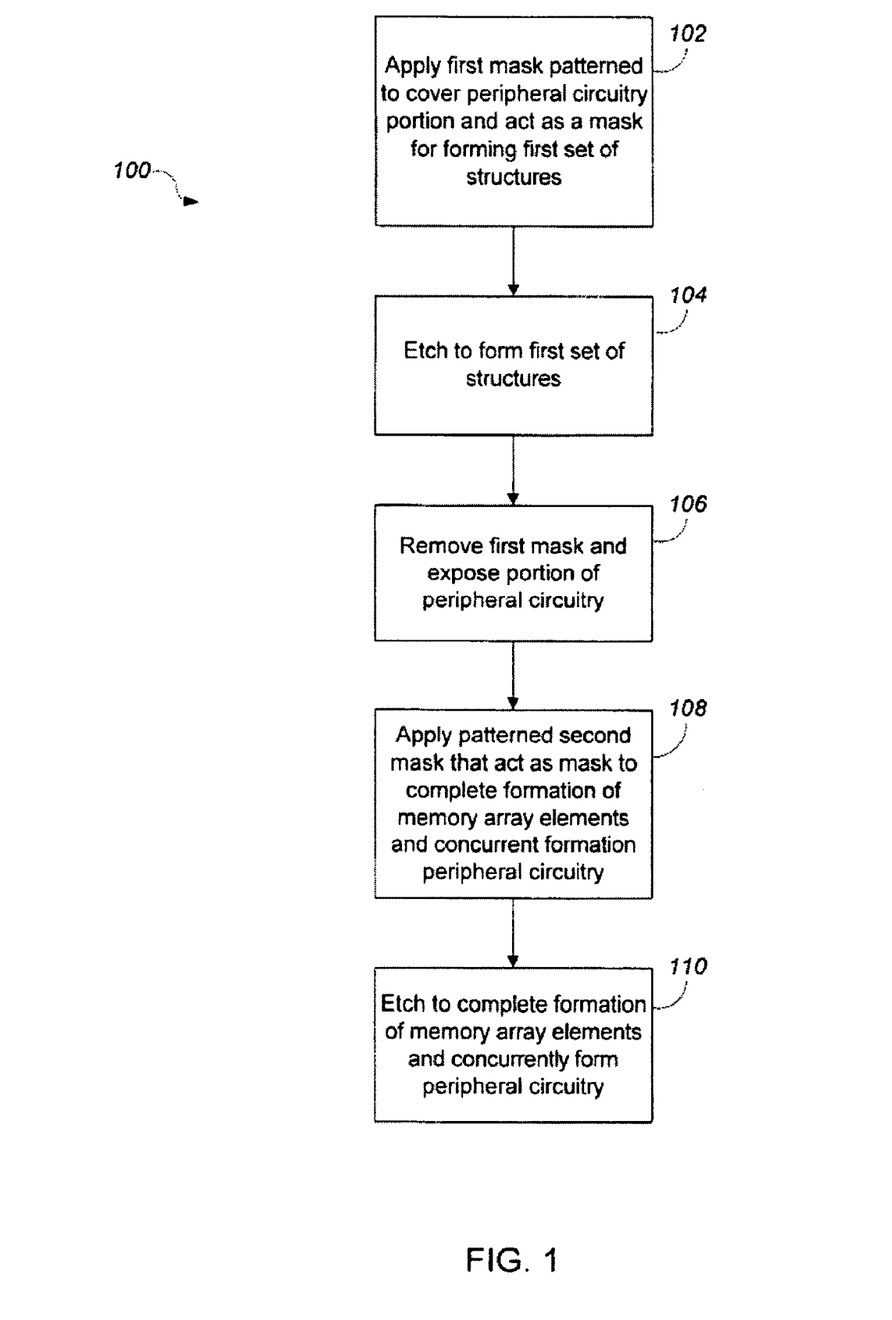
FIG. 1 shows a method for fabricating a memory array.

FIG. 1 shows a method 100 for fabricating a memory array. A system performing the method 100 applies, to a work piece from which the memory array is formed, a patterned first mask (step 102). The work piece can typically include but is not limited to, for example, a substrate, a gate oxide layer, one or more polysilicon layers, one or more stop layers, and one or more dielectric layers. The work piece usually includes a portion where memory elements are to be formed and a portion where peripheral circuitry is to be formed.

The first mask covers and protects from a subsequent etching process the portion of the work piece where the peripheral circuitry of the memory array is to be formed. The first mask is patterned, in the portion where memory array elements to be formed, so that subsequent etching forms a first set of structures. The first set of structures are intermediate structures in the memory array forming process. That is, the first set of structures are partially completed memory array elements. The first mask can include but is not limited to, for example, a photoresist ("PR") layer and a polymer layer. The system can transfer a pattern to the mask by performing, for example, a photoresist process.

The system etches the work piece to form the first set of structures (step 104). The etching results in the formation of the first set of structures. The system can use any etching process that is appropriate for memory array fabrication.

The system removes the first mask and exposes the portion where the peripheral circuitry is to be formed (step 106). The system can use any removal process, including etching, that is appropriate for memory array fabrication.

The system applies a patterned second mask to the work piece (step 108). The second mask is patterned so that further etching completes the formation of the memory array elements in the portion where memory array elements are to be formed. The second mask is also patterned so that the, etching concurrently forms peripheral circuitry in the portion where the peripheral circuitry is to be formed.

The system etches the work piece to form concurrently the memory array elements and the peripheral circuitry (step 110). The memory array elements can have a pitch that is less than the pitch of the first set of structures. As discussed, pitch is the distance between memory array elements.

Figure 2A:
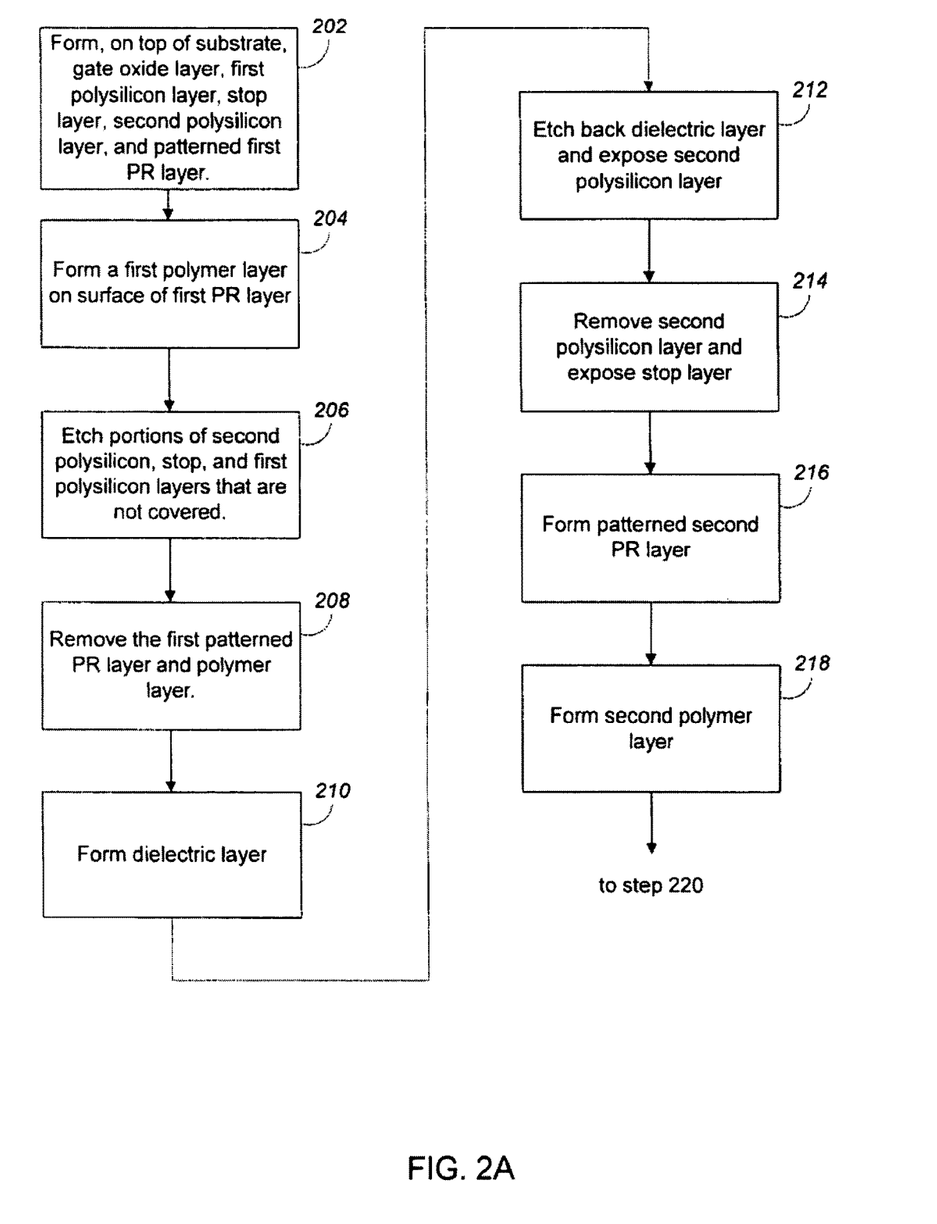
FIGS. 2A and 2B show one implementation method of the invention for fabricating a memory array.
Figure 2B:
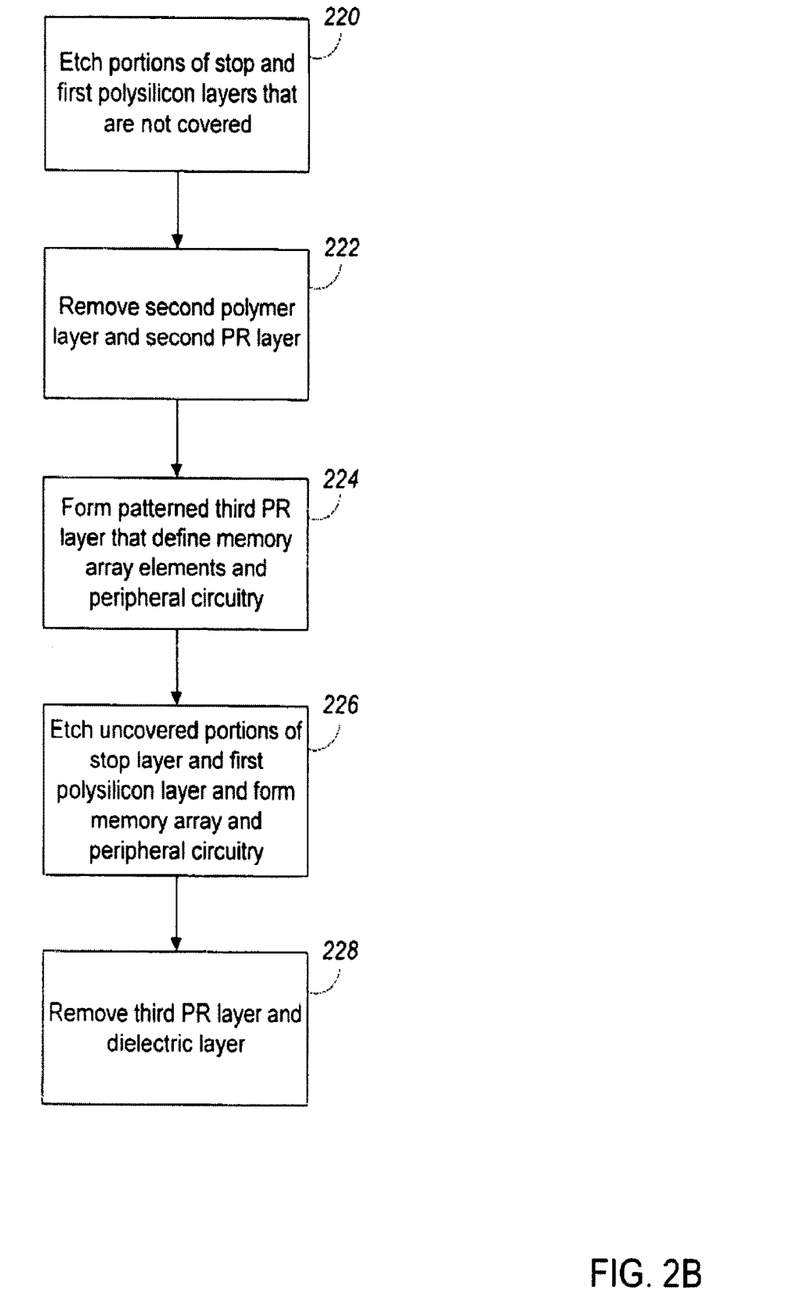

FIGS. 2A and 2B show one implementation method for fabricating a memory array. FIGS. 3A-3J illustrate the effects of performing the implementation method on an example work piece. FIGS. 3A-3J provide a top view and a cross-sectional view of the work piece.

Figure 3A:
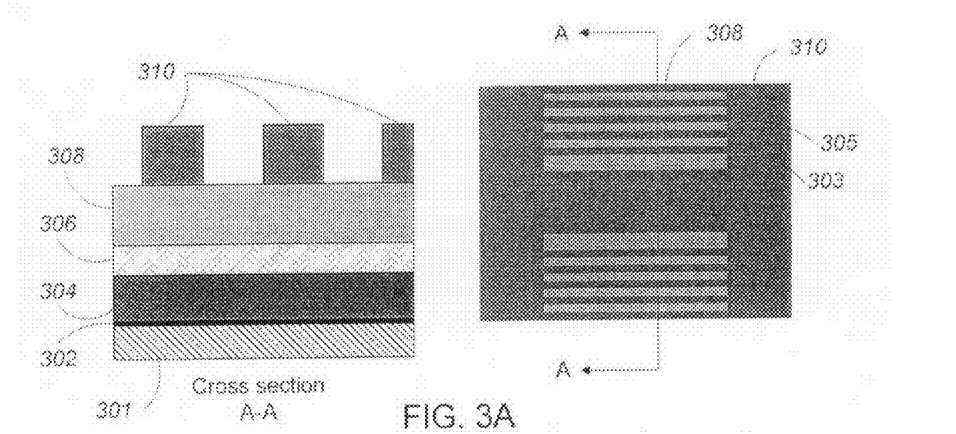
FIGS. 3A-3J illustrate the effects of performing that implementation method on an example work piece.

A system performing the implementation method sequentially forms, on top of a substrate 301, a gate oxide layer, a first polysilicon layer, a stop layer, a second polysilicon layer, and a patterned first PR layer (step 202). As shown in FIG. 3A, step 202 results in a work piece that includes a gate oxide layer 302 situated on top of the substrate, a first polysilicon layer 304 situated on top of the gate oxide layer 302, a stop layer 306 situated on top of the first polysilicon layer 304, a second polysilicon layer 308 situated on top of the stop layer 306, and a first PR layer 310 situated on top of the second polysilicon layer 308. Each of the layers has a top and a bottom surface area. The PR layer 310 is patterned as shown in FIG. 3A.

The pattern can define partially completed memory array elements such that the outer pitch of the partially completed memory elements are greater than the inner pitch of the partially completed memory array elements. When the work piece includes three or more partially completed memory array elements, the elements on the outside, i.e., those not having elements on both sides, are the outer elements. The other partially completed memory array elements, i.e., those having elements on both sides, are the inner elements. The distance between an outer partially completed memory array element and its adjacent partially completed memory array element is the outer pitch. The distance between inner partially completed memory array elements is the inner pitch. Compare, for example, pattern items 303 and 305 (the areas not covered be the first mask). Etching the substrate portion exposed by the pattern item 303 will result in a pitch that is greater than a pitch that results from etching the substrate portion exposed by the pattern item 305.

Forming the stop layer can include forming one of a silicon oxide layer and a spin-on-glass (SOG) layer. Forming the first and second polysilicon layer can include forming a polygate layer. Forming a polygate layer can include forming one of a metal silicide/polysilicon layer and a polysilicon layer.

Figure 3B:
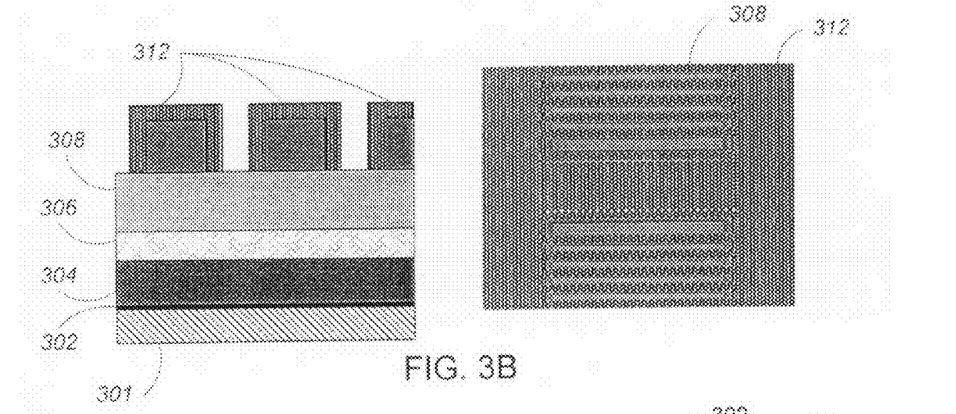

The system forms a first polymer layer 312 on the top surface of the first PR layer 310 (step 204). The first polymer layer 312 covers the first PR layer 310 as illustrated in FIG. 3B. The first polymer layer 312 and the first PR layer act as an etching mask. The portions of the work piece that are not covered by the etching mask can be removed by subsequent etching. The portions of the work piece that are covered by the etching mask are protected from subsequent etching.

Figure 3C:
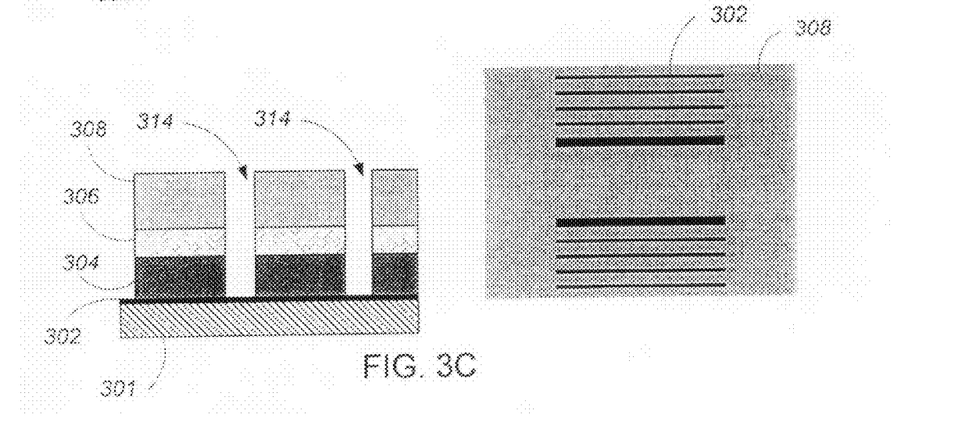

The system etches uncovered portions of the second polysilicon layer 308, the stop layer 306, and the first polysilicon layer 304 (step 206). The etching forms trenches, such as, for example, trenches 314, that expose portions of the gate oxide layer 302. The system removes the first PR layer 310 and the first polymer layer 312 (step 208). FIG. 3C shows the effects of steps 206 and 208. The material between the trenches are structures of partially completed memory array elements.

The system can etch different layers at different etch rates. For example, the system can etch the stop layer at an etch rate that is slower than the etch rate at which it etches the second polysilicon layer.

Figure 3D:
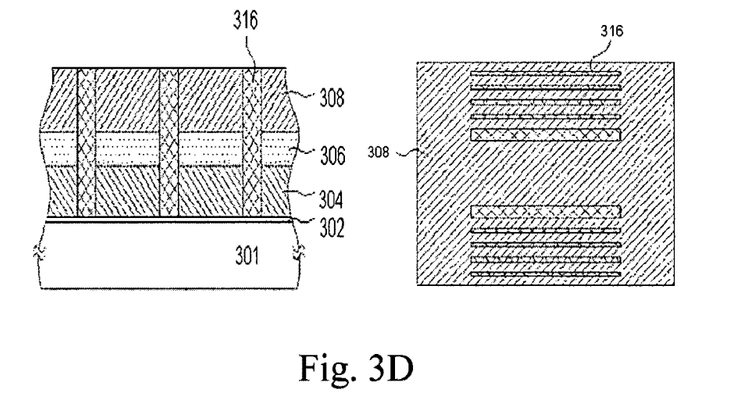

The system forms a dielectric layer 316 (step 210). The dielectric layer 316 fills the trenches formed in step 206 and covers the second polysilicon layer 308. The system removes, for example, by etching, the dielectric layer 316 so that the top surface of the second polysilicon layer 308 is exposed (step 212). FIG. 3D shows the effects of steps 210 and 212.

Forming the dielectric layer can include forming one of an oxide layer, a silicon nitride layer, and an organic film layer. Forming an organic film layer can include forming one of a photoresist layer and a bottom antireflective coating layer.

Figure 3E:
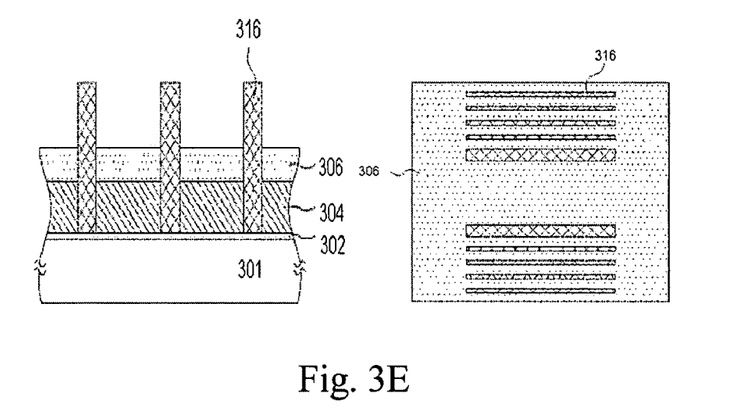

The system removes the second polysilicon layer 308 and exposes the top surface of the stop layer 306 (step 214). One technique for removing the second polysilicon layer includes performing a wet etch process that uses $HNO_3$ and HF. FIG. 3E shows the effect of step 214.

Where it uses etching to remove the second polysilicon layer, the system can etch the second polysilicon layer at an etch rate that is faster than the etch rate at which it etches the dielectric layer.

Figure 3F:
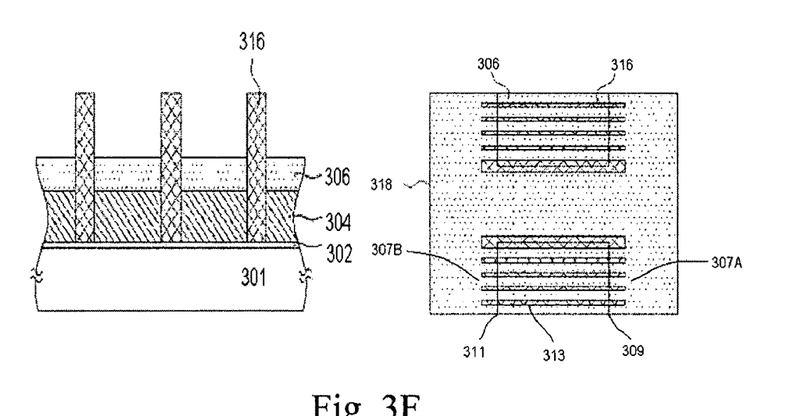

The system forms a second PR layer 318 (step 216). The second PR layer 318 is patterned as shown in FIG. 3F. Specifically, the second PR layer 318 covers the portion of the work piece where the peripheral circuitry are to be formed. Furthermore, the system overlaps the second PR layer 318 on the edges, e.g., edges 307A and 307B (FIG. 3F), of the portion of the work piece where the memory array elements are to be formed. Doing so protects from etching the ends of partially completed memory array elements, e.g., ends 309 and 311 of partially completed memory array element 313, and ensures that the memory array elements eventually formed (i.e., the completed memory array elements) do not have disconnects with and are connected to their respective peripheral circuitry.

Figure 3G:
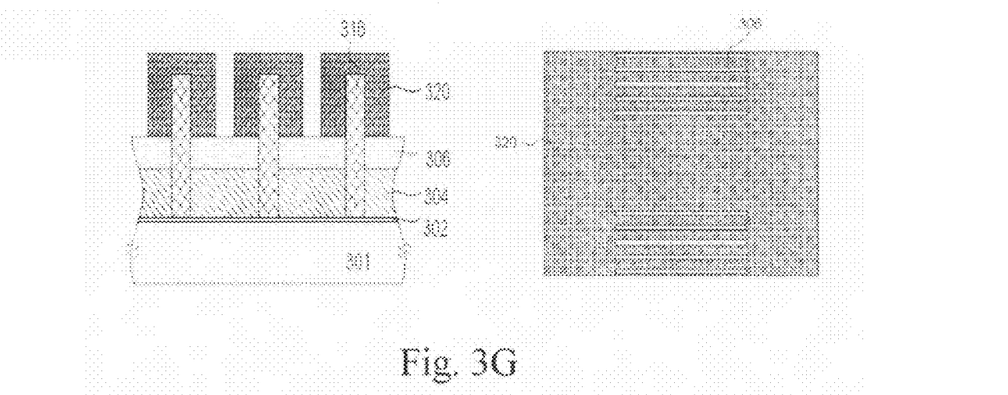

The system forms a second polymer layer 320 (step 218). The second polymer layer covers the work piece as shown in FIG. 3G.

Figure 3H:
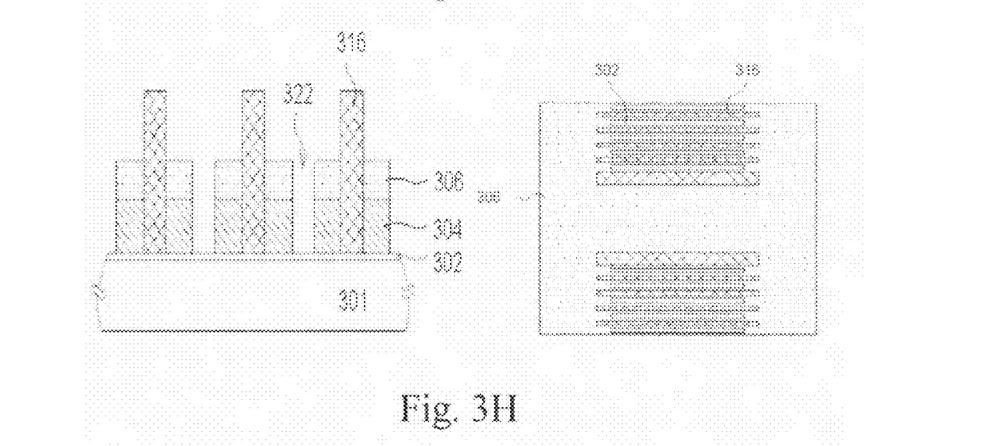

The system etches uncovered portions of the stop layer 306 and the first polysilicon layer 304 (step 220). The system removes the second polymer layer 320 and the second PR layer 318 (step 222). FIG. 3H shows the effects of steps 220 and 222. The etching forms a second set of trenches, such as trench 322, through which additional portions of the gate oxide layer 302 are exposed.

Figure 3I:
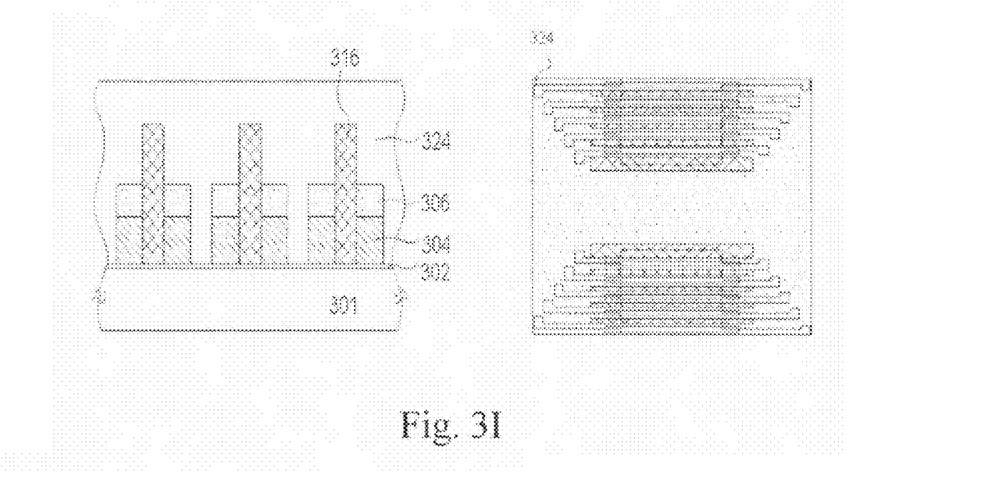

The system forms a third PR layer 324 that is patterned so that further etching completes the formation of memory array elements and concurrently forms the peripheral circuitry (step 224). The PR layer 324 acts as an etching mask. FIG. 3I shows one example pattern of the third PR layer 324. Alternatively, other patterns that define other peripheral circuitry can be used.

Figure 3J:
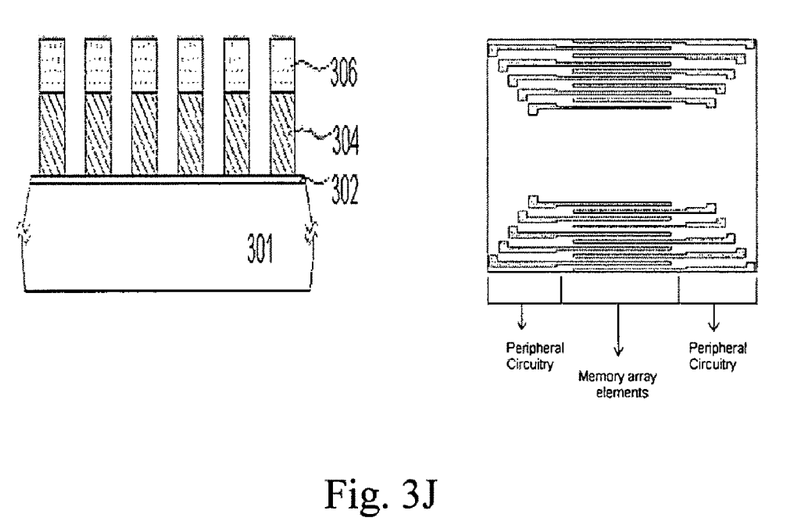

The system etches uncovered portions of the stop layer 306 and the first polysilicon layer 304 and completes the formation of the memory array elements and concurrently forms the peripheral circuitry (step 226). The completed memory array elements have a pitch that is less than the pitch of the partially completed memory array elements (i.e., the structures discussed above in reference to steps 206 and 208). The pitch can be reduced by half, for example. The system removes the third PR layer 324 and the dielectric layer 316 (step 228). In instances where the dielectric layer 316 is made of $Si_3N_4$ or SiON, the system can remove the dielectric layer 316 by performing a wet etch using $H_3PO_4$. FIG. 3J shows the memory array elements and peripheral circuitry formed by the above described steps.

Figure 4A:
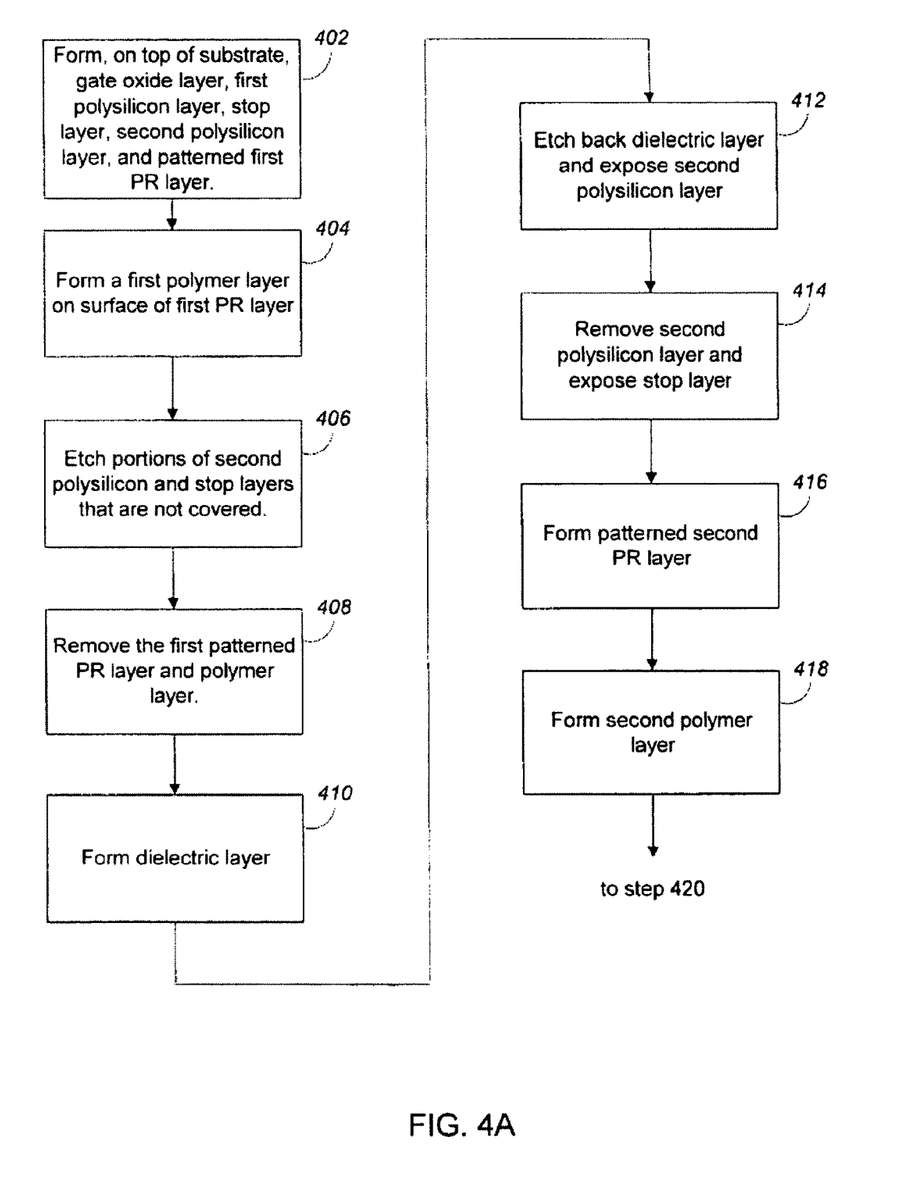
FIGS. 4A and 4B show a second implementation method for fabricating a memory array.
Figure 4B:
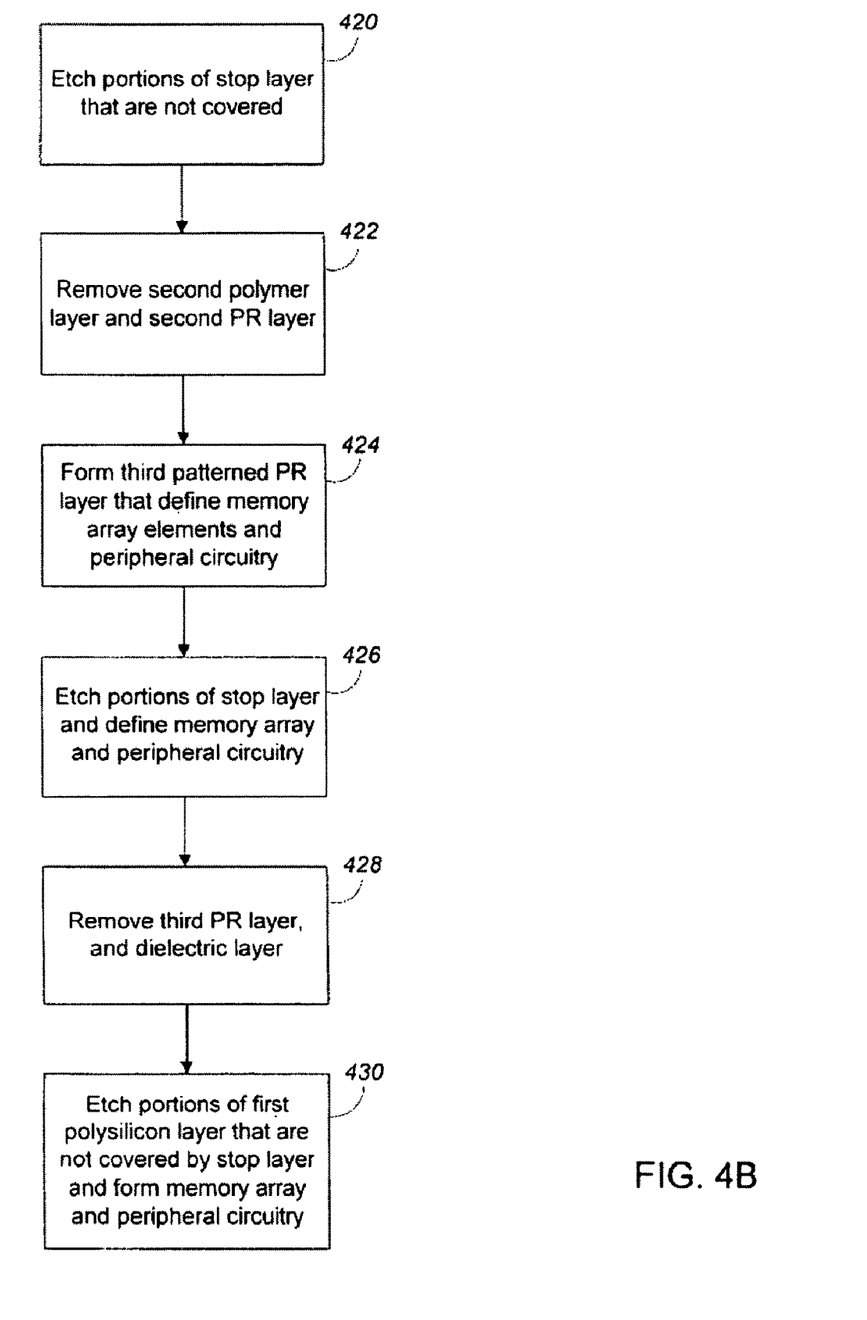

FIGS. 4A and 4B show a second implementation method for fabricating a memory array. FIGS. 5A-5J illustrate the effects of performing the second implementation method on a second example work piece. FIGS. 5A-5J provide a top view and a cross section view of the second example work piece.

Figure 5A:
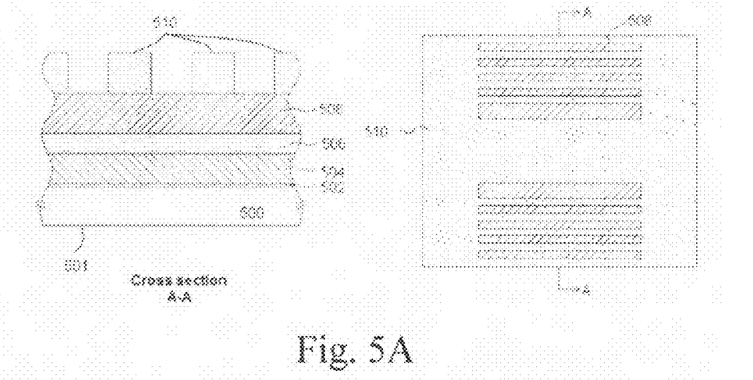
FIGS. 5A-5J illustrate the effects of performing that second implementation method on a second example work piece.
Like reference symbols in the various drawings indicate like elements.

A system performing the second implementation method sequentially forms, on top of a substrate, a gate oxide layer, a first polysilicon layer, a stop layer, a second polysilicon layer, and a patterned first PR layer (step 402). As shown in FIG. 5A, step 402 results in a work piece that includes the gate oxide layer 502 situated on top of the substrate 501, the first polysilicon layer 504 situated on top of the gate oxide layer 502, the stop layer 506 situated on top of the first polysilicon layer 504, the second polysilicon layer 508 situated on top of the stop layer 506, and the first PR layer 510 situated on top of the second polysilicon layer 508. Each of the layers has a top and a bottom surface area. The PR layer 510 is patterned as illustrated in FIG. 5A.

Figure 5B:
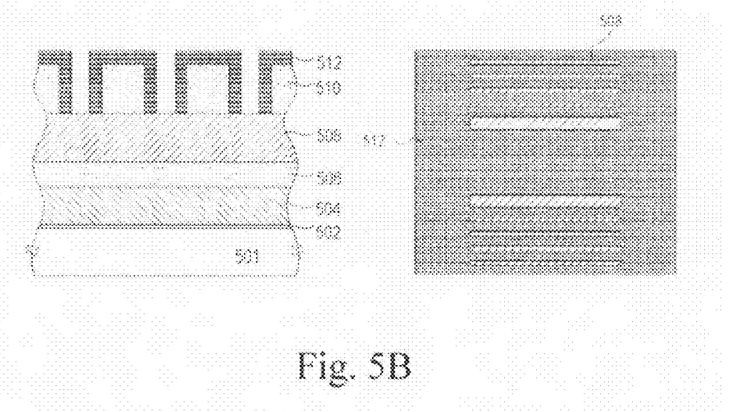

The system forms a first polymer layer 512 on the surface of the first PR layer 510 (step 404). The first polymer layer 512 covers the first PR layer 510 as illustrated in FIG. 5B. The first polymer layer 512 and the first PR layer 510 act as an etching mask. The portions of the work piece that are not covered by the etching mask can be removed by subsequent etching. The portions of the work piece that are covered by the etching mask are protected from a subsequent etching.

Figure 5C:
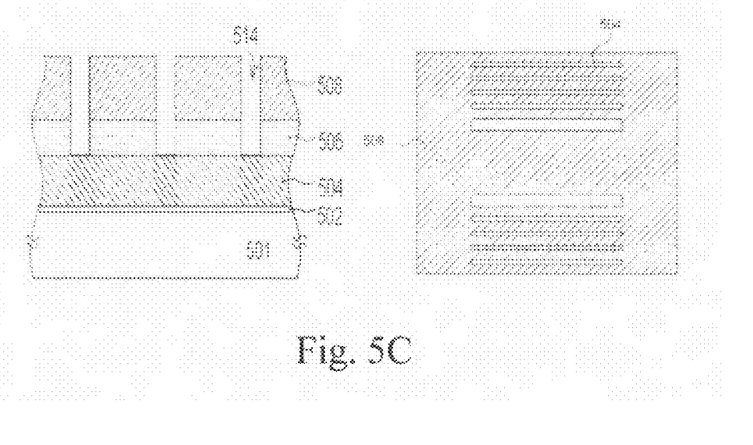

The system etches uncovered portions of the second polysilicon layer 508 and the stop layer 506 (step 406). The etching forms trenches, such as, for example, trenches 514, that expose portions of the first polysilicon layer 504. The system removes the first PR layer 510 and the first polymer layer 512 (step 408). FIG. 5C shows the effects of steps 406 and 408. The material between the trenches are structures of partially completed memory array elements.

Figure 5D:
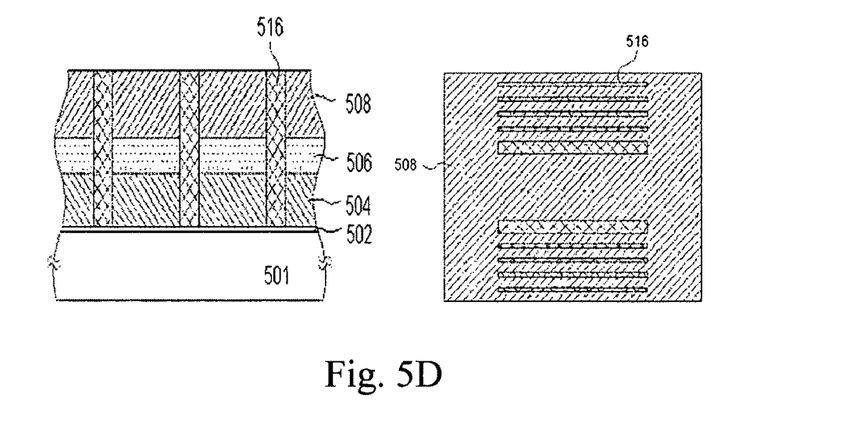

The system forms a dielectric layer 516 (step 410). The dielectric layer 516 fills the trenches formed in step 406 and covers the second polysilicon layer 508. The system removes, e.g., by etching back, the dielectric layer 516 so that the top surface of the second polysilicon layer 508 is exposed (step 412). FIG. 5D shows the effects of steps 410 and 412.

Figure 5E:
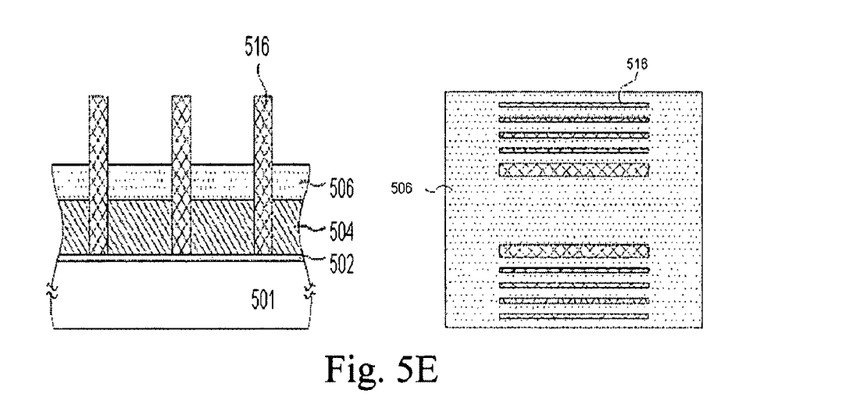

The system removes the second polysilicon layer 508 and exposes the top surface of the stop layer 506 (step 414). FIG. 5E shows the effect of step 414.

Figure 5F:
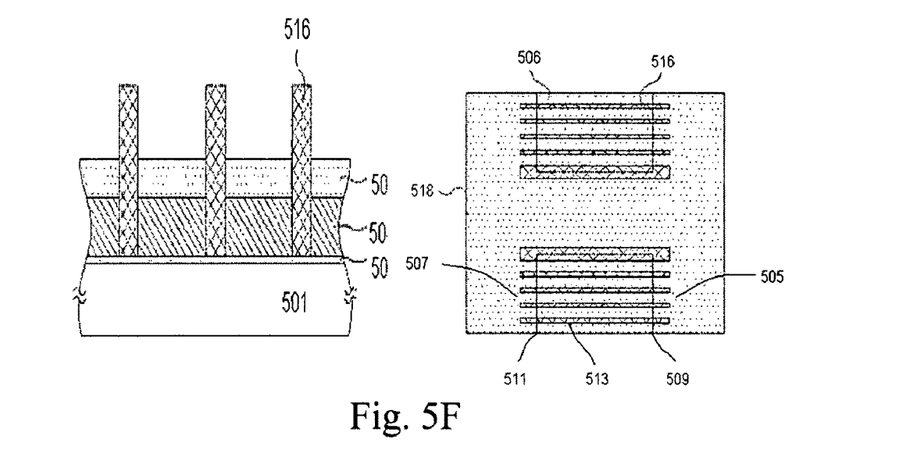

The system forms a second PR layer 518 (step 416). The second PR layer 518 is patterned as shown in FIG. 5F. Specifically, the second PR layer 518 covers the portion of the work piece where the peripheral circuitry is to be formed. Furthermore, the system overlaps the second PR layer 518 on the edge, e.g., edges 505 and 507, of the portion of the work piece where the memory array elements are to be formed. As discussed above, doing so protects from etching the ends of partially completed memory array elements, e.g., ends 509 and 511 of partially completed memory array element 513, and ensures that the memory array elements eventually formed (i.e., the completed memory array elements) are connected to their respective peripheral circuitry.

Figure 5G:
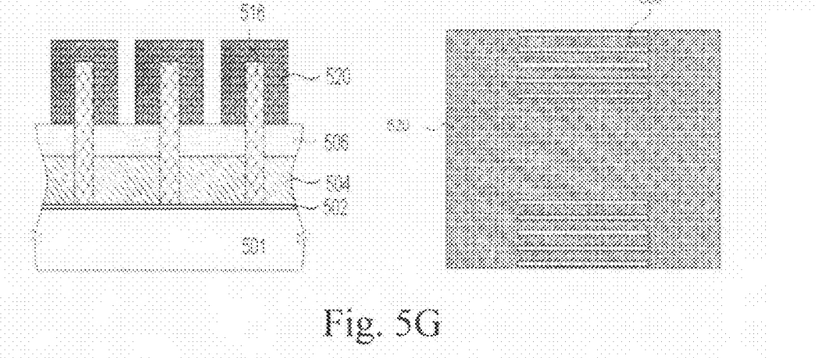

The system forms a second polymer layer 520 (step 418). The second polymer layer is patterned and covers the work piece as shown in FIG. 5G.

Figure 5H:
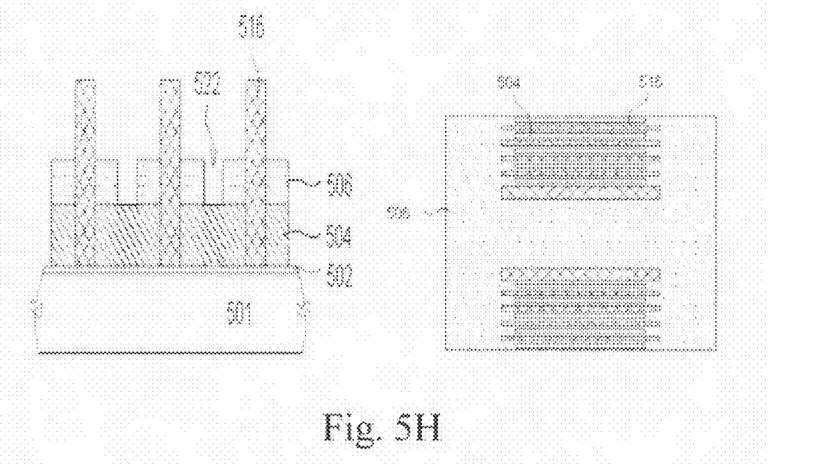

The system etches uncovered portions of the stop layer 506 (step 420). The system removes the second polymer layer 520 and the second PR layer 518 (step 422). FIG. 5H shows the effects of steps 420 and 422: The etching forms a second set of trenches, such as trenches 522 and 523, through which additional portions of the first polysilicon layer 504 are exposed.

Figure 5I:
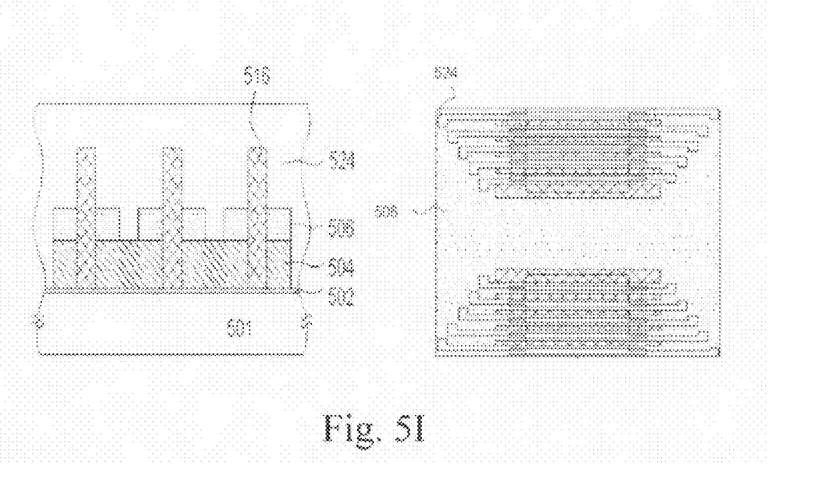

The system forms a third PR layer 524 that is patterned so that further etching completes the formation of the partially formed memory array elements and concurrently forms the peripheral circuitry (step 424). The third PR layer 524 acts as an etching mask. FIG. 5I shows one example pattern of the third PR layer 524. Alternatively, other patterns that define other peripheral circuitry can be used.

Figure 5J:
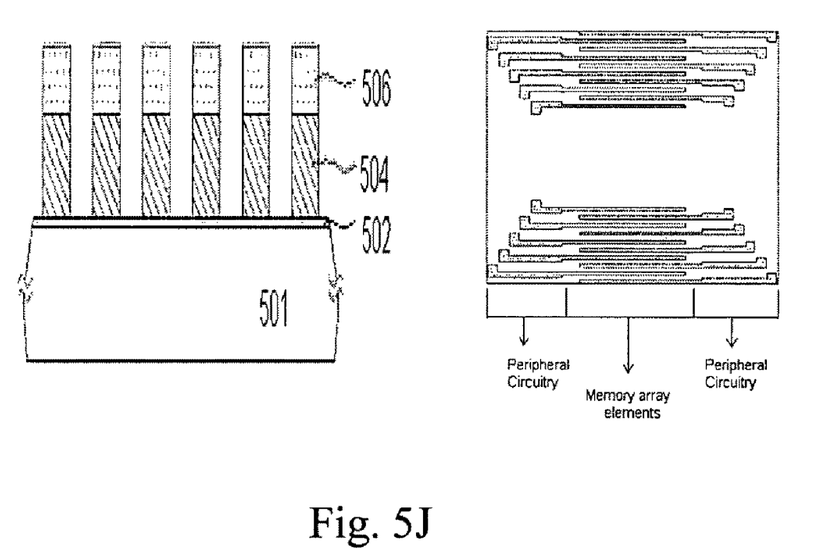

The system etches uncovered portions of the stop layer 506 and defines the memory array elements and peripheral circuitry (step 426). The system removes the third PR layer 524 and dielectric layer 516 (step 428). The system etches portions of the first polysilicon layer 504 using the stop layer 506 as a mask, and concurrently forms the memory array elements and the peripheral circuitry (step 430). The memory array elements have a pitch that is less than the pitch of the structures described in reference to steps 406 and 408. FIG. 5J shows the memory array elements and peripheral circuitry formed by the above described steps. The stop layer 506 can be retained or removed.

Method steps of the invention can be performed by one or more programmable processors executing a computer program to perform functions of the invention by operating on input data and generating output. Method steps can also be performed by, and apparatus of the invention can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in special purpose logic circuitry.

A number of embodiments of the invention have been described. Nevertheless, it will be understood that various modifications may be made without departing from the spirit and scope of the invention. For example, the steps of the invention can be performed in a different order and still achieve desirable results. The system described can form any types of mask and is not limited to the masks described. The system can apply any pattern transfer technique. The system can transfer any pattern to the mask and is not limited to only the example patterns described. The system can, thus, concurrently form any memory array element and any peripheral circuitry. The work piece can include additional or different layers to those example layers described. The system can perform the different etching steps at different etching rates. The system can use any removal process, including etching. Accordingly, other implementations are within the scope of the following claims.

What is claimed is:

1. A method for pitch reduction, the method comprising:
   forming a multi-layer structure;
   forming strips of a mask material on the multi-layer structure, the strips of mask material having respective sidewall surfaces separated by a separation width;
   performing a process to expand the strips of mask material to reduce the separation width, the expanded strips of mask material being a first etch mask;
   etching the multi-layer structure using the first etch mask, thereby forming a first modified multi-layer structure comprising plurality of first trenches;
   removing the first etch mask;
   forming a second etch mask overlying the plurality of first trenches;
   etching the first modified multi-layer structure using the second etch mask to form a second modified multi-layer structure comprising a plurality of second trenches with pairs of structures defined between adjacent first trenches, wherein respective pairs of structures comprise first and second structures separated by a second trench in the plurality of second trenches;
   forming a third etch mask overlying the second modified multi-layer structure; and
   etching portions of the second modified multi-layer structure to create a modified array of said pairs of structures, the modified array of said pairs of structures comprising a central memory array portion having first and second ends, a first peripheral circuitry portion extending from the first end and a second peripheral circuitry portion extending from the second end, the first peripheral circuitry portion being extensions of the first structures, and the second peripheral circuitry portion being extensions of the second structures.

2. The method of claim 1, wherein the forming the multi-layer structure step comprises:
   forming a gate dielectric layer on a substrate;
   forming a first polysilicon layer on the gate dielectric layer;
   forming a stop layer on the first polysilicon layer; and
   forming a second polysilicon layer on the stop layer.

3. The method of claim 2, wherein the strips of mask material comprise photoresist, and the process to expand the strips of mask material includes depositing a first polymer layer over the strips of mask material.

4. The method of claim 3, wherein the etching the multi-layer structure using the first etch mask comprises:
   etching the second polysilicon layer, the stop layer, and the first polysilicon layer using the first etch mask, thereby forming the plurality of first trenches.

5. The method of claim 4, wherein the forming the second etch mask step comprises:
   filling the first set of trenches with a dielectric material, thereby forming dielectric strips having respective top and sidewall surfaces;
   removing the second polysilicon layer to expose the stop layer and a portion of the sidewall surfaces of the dielectric strips; and
   forming a second polymer layer on the top and exposed sidewall surfaces of the dielectric strips, the dielectric strips and the second polymer layer being the second etch mask.

6. The method of claim 5, wherein the etching the first modified multi-layer structure using the second etch mask step comprises etching the stop layer and the first polysilicon layer using the second etch mask, thereby forming the plurality of second trenches.

7. The method of claim 3, wherein the etching the multi-layer structure using the first etch mask step comprises:
   etching portions of the second polysilicon layer and the stop layer using the first etch mask, thereby forming the plurality of first trenches.

8. The method of claim 7, wherein the forming the second etch mask step comprises:
   filling the first set of trenches with a dielectric material, thereby forming dielectric strips having respective top and sidewall surfaces;
   removing the second polysilicon layer to expose the stop layer and a portion of the sidewall surfaces of the dielectric strips; and
   forming a second polymer layer on the top and exposed sidewall surfaces of the dielectric strips, the dielectric strips and the polymer layer being the second etch mask.

9. The method of claim 8, wherein the etching the first modified multi-layer structure using the second etch mask step comprises etching the stop layer using the second etch mask, thereby forming the plurality of second trenches; and further comprising:
   removing the second etch mask; and
   etching the first polysilicon layer using the stop layer as a mask.

10. The method of claim 1, wherein the second modified multi-layer structure etching step comprises forming enlarged extensions of the first and second structures, said enlarged extensions of the first and second structures having distal ends.

11. The method of claim 10, wherein the enlarged extensions forming step is carried out so that the distal ends are positioned at different distances from the central memory array portion.

12. The method of claim 11, wherein the enlarged extensions forming step is carried out so that the distal ends are enlarged relative to the remainder of the enlarged extensions of the first and second structures.

13. The method of claim 11, wherein the distal ends extend in directions transverse to the remainder of the first and second structures.

* * * * *